United States Patent
Lin et al.

(10) Patent No.: US 8,796,095 B2
(45) Date of Patent: *Aug. 5, 2014

(54) INTEGRATED METHOD FOR FORMING METAL GATE FINFET DEVICES

(75) Inventors: Chia-Pin Lin, Xinpu Township (TW); Wen-Sheh Huang, Hsinchu (TW); Tian-Choy Gan, Kluang Johor (MY); Chia-Lung Hung, Taipei (TW); Hsien-Chin Lin, Hsinchu (TW); Shyue-Shyh Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 376 days.

This patent is subject to a terminal disclaimer.

(21) Appl. No.: 13/241,014

(22) Filed: Sep. 22, 2011

(65) Prior Publication Data

US 2012/0015493 A1 Jan. 19, 2012

Related U.S. Application Data

(63) Continuation of application No. 12/712,594, filed on Feb. 25, 2010, now Pat. No. 8,034,677.

(51) Int. Cl.
 *H01L 21/336* (2006.01)
(52) U.S. Cl.
 USPC ............ 438/283; 438/303; 257/E21.433
(58) Field of Classification Search
 USPC .................. 438/197, 285, 303, 595, 283; 257/E21.433
 See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 8,034,677 B2 * | 10/2011 | Lin et al. | 438/197 |
| 2004/0087133 A1 | 5/2004 | Kumar | |
| 2005/0142735 A1 | 6/2005 | Shin | |
| 2005/0153490 A1 | 7/2005 | Yoon et al. | |
| 2006/0099762 A1 | 5/2006 | Kim | |
| 2007/0037343 A1 | 2/2007 | Colombo et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2008/0290470 A1 | 11/2008 | King et al. | |
| 2008/0296632 A1 | 12/2008 | Moroz et al. | |

(Continued)

*Primary Examiner* — Quoc Hoang
(74) *Attorney, Agent, or Firm* — Duane Morris LLP

(57) ABSTRACT

Provided is a high-k metal gate structure formed over a semiconductor fin. A nitride layer is formed over the gate structure and the semiconductor fin, using two separate deposition operations, the first forming a very thin nitride film. Implantation operations may be carried out in between the two nitride film deposition operations. The first nitride film may be $SiN_x$ or $SiCN_x$ and the second nitride film is $SiCN_x$. The nitride films may be combined to form low wet etch rate spacers enabling further processing operations to be carried out without damaging underlying structures and without requiring the formation of further dummy spacers. Further processing operations include epitaxial silicon/SiGe processing sequences and source/drain implanting operations carried out with the low etch rate spacers intact.

18 Claims, 4 Drawing Sheets

(56) References Cited

U.S. PATENT DOCUMENTS

2009/0181477 A1   7/2009   King et al.
2009/0206446 A1   8/2009   Russ et al.
2010/0035423 A1   2/2010   Clark

* cited by examiner

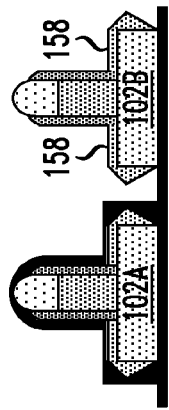
FIG. 2(G)
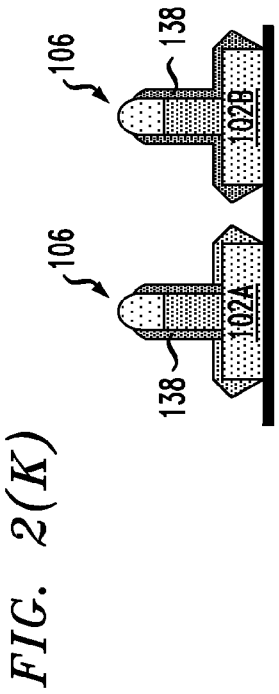
FIG. 2(H)
FIG. 2(I)
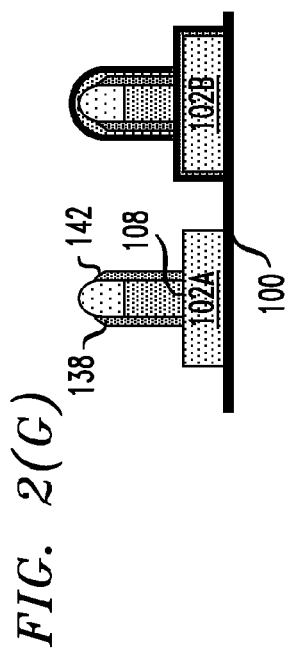
FIG. 2(J)
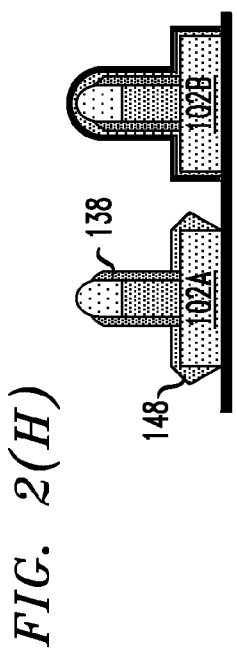
FIG. 2(K)
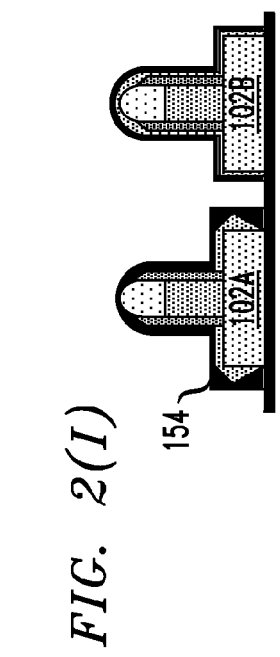
FIG. 2(L)

INTEGRATED METHOD FOR FORMING METAL GATE FINFET DEVICES

RELATED APPLICATION

This application is a continuation application of U.S. patent application Ser. No. 12/712,594, filed on Feb. 25, 2010, the contents of which are hereby incorporated by reference as if set forth in their entirety.

TECHNICAL FIELD

The disclosure relates, most generally, to semiconductor device fabrication and, more particularly, to a method for fabricating high-k metal gate transistors over semiconductor fin structures, and the devices so formed.

BACKGROUND

Semiconductor fins are widely used in advanced semiconductor manufacturing technology because of the increased integration levels they provide. For example, when transistor devices such as FinFET, fin Field Effect Transistor, devices are formed they provide a gate width that may be larger, by an order of magnitude, than the gate width of the transistor formed on the same substrate section in which the semiconductor fin is formed because the gate extends over the top and sides of the fins, all of which serve as channels. Semiconductor fins have high aspect ratios and require advanced and dedicated processing operations to forming working FinFET or other devices using the semiconductor fins.

When these devices are formed using advanced processing technology and miniaturized features of increasingly small dimensions, particular care must be taken in forming the features. It is critical to ensure that the correct dimensions are achieved and that the structures are accurately positioned. It is also critical to ensure that dopant impurities are accurately introduced into particular desired locations so that they do not extend past their desired boundaries where they may undesirably overlap and/or cross-contaminate other features which may destroy device functionality. In particular, it is particularly important to ensure that the impurities introduced by ion implantation or other processes are accurately introduced into the exact locations where they are needed.

It is also desirable to economize the number of processing operations needed to produce a semiconductor device. When fewer processing operations are used, the cost to produce a device is reduced and the number of opportunities to misprocess a substrate is also reduced. It is further desirable to produce the semiconductor devices using robust materials that are not subject to attack and degradation during subsequent processing operations.

One shortcoming associated with the desire to achieve the aforementioned goals of increased integration in the formation of semiconductor fin devices, is illustrated in FIGS. 1(A)-1(F) which illustrate a prior art processing sequence. FIG. 1(A) shows semiconductor fin 3 formed over substrate 1. It should be noted that semiconductor fin 3 is viewed along a longitudinal cross-section and that gate structure 5 extends over the respective sides of the fins, and in- and out-of the plane of the figures. Gate structure 5 is formed over surface 7 of semiconductor fin 3. Gate structure 5 includes a high-k gate dielectric material and a metal gate layer formed essentially at interface 9 but not visible in FIG. 1(A). Over these interfacial features are polysilicon 11 and hardmask 13. In order to protect the high-k gate dielectric material and the metal gate formed at interface 9, seal spacers 17 are formed along the sidewalls of gate structure 5. Seal spacers 17 are shown in FIG. 1(B) and may be formed of nitride, using conventional CVD, chemical vapor deposition, processing. Seal spacers 17 formed of conventional nitride materials are subject to attack and may be removed using a conventional solution of phosphoric acid, $H_3PO_4$.

After seal spacers 17 are formed to a sufficiently wide width to protect the metal gate and high-k dielectric at interface 9, an implantation process is carried out as shown in FIG. 1(C). Arrows 19 indicate the acceleration of particles being implanted into semiconductor fin 3 and other semiconductor portions 21. The implantation process carried out may be an LDD, lightly doped drain, implantation process or a PKT, packet implantation process, or both. The implant operation damages unprotected surface 7 of semiconductor fin 3 as indicated by damaged portions 23. The implantation process may advantageously utilize an angled implant so that the damaged portions 23 may also occur on the sides of the semiconductor fins (not shown).

FIG. 1(D) shows the structure after dummy spacers 27 have additionally been formed using deposition and anisotropic etching processes. Dummy spacers 27 are typically formed of an oxide layer and a nitride layer and are used to define the area upon which epitaxial silicon formation will take place. Due to the damage of the semiconductor surface as indicated in FIG. 1(C), surface 7 is attacked and receded during the formation of dummy spacers 27, particularly during the etching portion of the process used to form dummy spacers 27, and this attack results in recessed portions 31 which generally represent loss of the semiconductor material.

FIG. 1(E) shows the structure of FIG. 1(D) after epitaxial silicon growth has been carried out. Epitaxial silicon 33 is formed on exposed silicon surfaces with dummy spacers 27 necessarily intact as their removal would also undesirably remove or at least attack conventional seal spacers 17. It may then be desired to carry out a source/drain implant with critical dimensions that are different than the CD's of the dummy spacers 27 that were used to determine the bounds of the epitaxial silicon formation process. When dummy spacers 27 are removed such as shown in FIG. 1(F), and such as may be done prior to the formation of MSW's, major sidewall spacers used to define source/drain areas, a large gap 37 undesirably results between the epitaxially grown silicon 33, and gate structure 5.

It can be seen that the limitations of conventional processing cause the damage and recession of the semiconductor fin material and necessitate the use of wide dummy spacers which result in additional shortcomings such as gap 37.

It would therefore be desirable to produce FinFET and other semiconductor fin devices that are not prone to the problems associated with the shortcomings of conventional technology.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIGS. 2(A)-2(M) are cross-sectional views showing an exemplary process sequence according to the invention.

DETAILED DESCRIPTION

The present invention provides for forming a high-k or other metal gate structure over a semiconductor fin and then forming a nitride layer covering the gate and the semiconductor fin, using two separate deposition operations, the first forming a very thin nitride film. Implantation operations such as a lightly doped drain, LDD implant operation and a packet, PKT, implant operation are carried out in between the two nitride film deposition operations. The thin nitride film may be $SiN_x$ or $SiCN_x$ and precludes the need to form wide spacers alongside the gate structure prior to implant, which are needed in conventional processing to avoid damaging the high-k gate dielectric and metal formed on the fin. The second nitride film is a $SiCN_x$ film formed by PECVD, LPCVD or ALD and includes low wet etch rates in $H_3PO_4$ and dilute HF acid which enables further processing operations to be carried out without damaging the nitride films or underlying structures and without requiring the formation of additional dummy spacers. The nitride films may be combined to form low wet etch rate spacers. The further processing operations include dual epitaxial silicon processing sequences, epitaxial silicon/SiGe processing sequences and source/drain implanting operations which may be carried out with the low etch rate spacers intact.

Figure 1A:
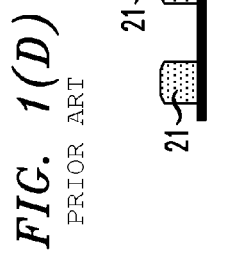
FIGS. 1(A)-1(F) are cross-sectional views showing a conventional processing flow according to the PRIOR ART.
Figure 1B:
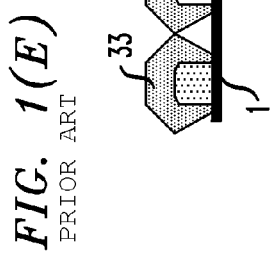
Figure 1C:
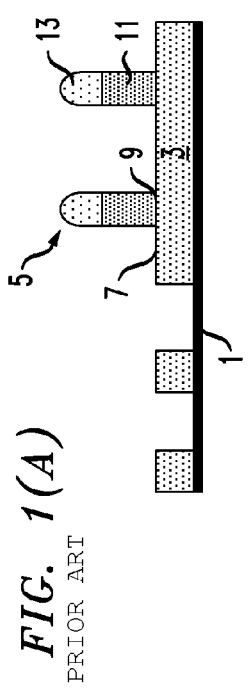
Figure 1D:
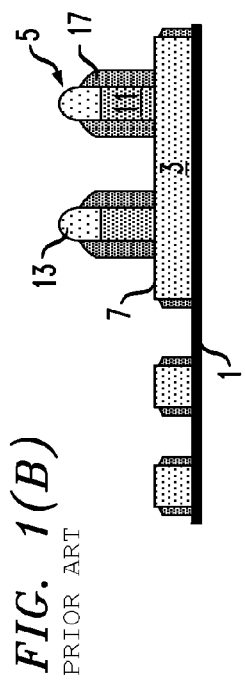
Figure 1E:
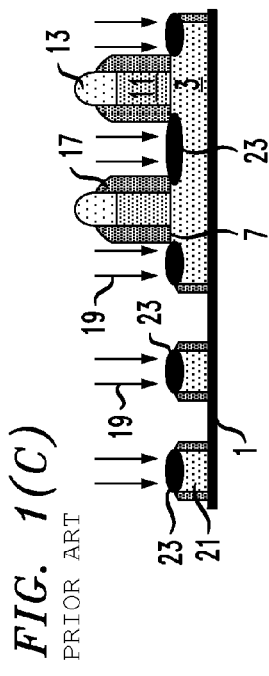
Figure 1F:
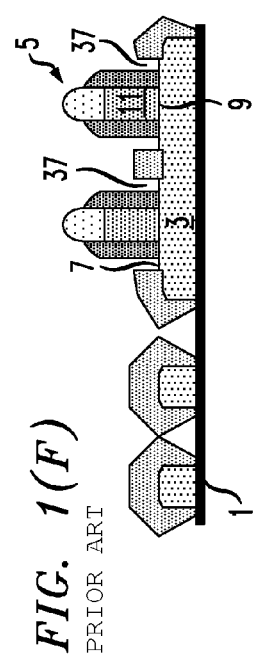
Figure 2A:
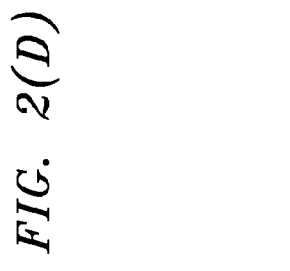
Figure 2B:
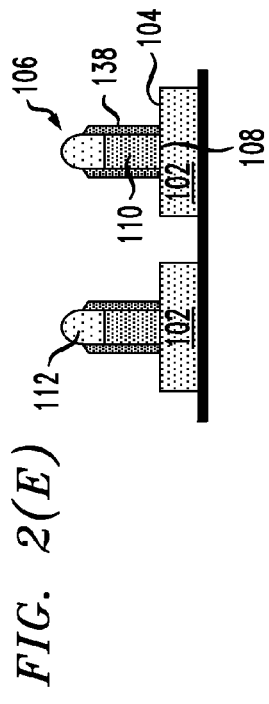

FIG. 2(A) is a cross-sectional view showing semiconductor fins 102 formed over substrate 100. Substrate 100 may be any of various suitable semiconductor device processing substrates such as silicon or other suitable semiconductor materials. In one exemplary embodiment, semiconductor fin 102 may be an SOI substrate. Semiconductor fin 102 may be formed of silicon, SiGe, germanium or various other suitable semiconductor materials and may be formed according to conventional processing operations. Semiconductor fins 102 include surface 104. Gate structures 106 are formed over semiconductor fins 102 and include interface 108 which advantageously includes a gate dielectric and a metal gate film and is covered by polysilicon 110 and, in the illustrated embodiment, optional hard mask 112. Semiconductor fins 102 and gate structures 106 may be formed to various dimensions and may include high aspect ratios.

Figure 3:
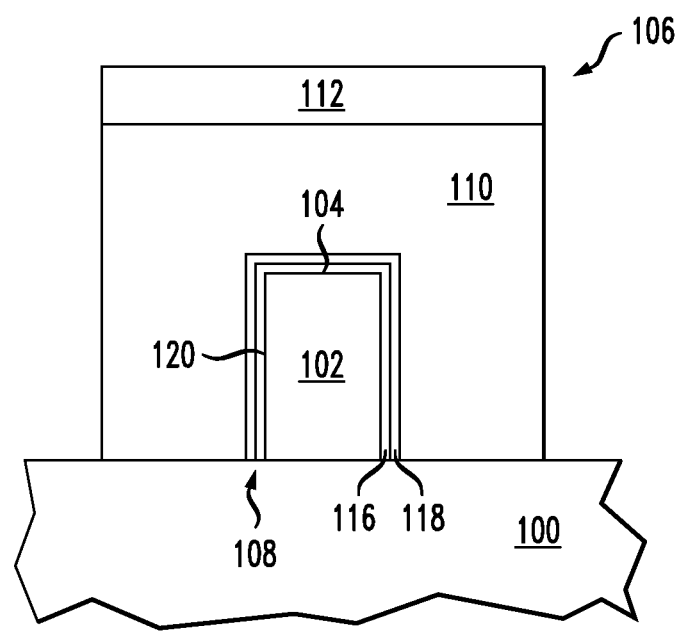
FIG. 3 is a cross-sectional view taken at an orthogonal angle with respect to the cross-sectional view shown in FIG. 2(A), and illustrates further aspects of the invention.

Semiconductor fin 102 is illustrated in FIG. 2(A) along its longitudinal cross-section and it should be noted that gate structure 106 extends past and along the respective sides of semiconductor fin 102, i.e., in and out of the plane of FIG. 2(A). FIG. 3, taken along line 103-103 of FIG. 2(A) shows an orthogonal cross sectional view with respect to the cross-sectional view of FIG. 2(A). FIG. 3 shows semiconductor fin 102 over substrate 100 and with gate structure 106 thereover. Semiconductor fins 102 may have high aspect ratios such as ranging from 2:1 to 7:1 (height:width) and may include a width that may vary from about 10-50 nm in various exemplary embodiments and a height of greater than about 30-50 nanometers but other heights and widths may be used in other exemplary embodiments. Gate structure 106 includes polysilicon 110 and hard mask 112 with gate dielectric 116 and metal gate film 118 formed over semiconductor fin 102 at interface 108, including along sides 120 of semiconductor fin 102. Gate dielectric 116 may advantageously be a high-k gate dielectric and will be referred to as high-k dielectric 116 hereinafter, although other dielectric materials may be used.

Now returning to the process sequence illustrated by FIGS. 2(A)-2(M), FIG. 2(B) shows thin nitride film 122 formed over the structure shown in FIG. 2(A). Thin nitride film 122 may be a $SiN_x$ material or an $SiCN_x$ material and may be formed to a thickness of 5 nm in one exemplary embodiment. According to other exemplary embodiments, other thicknesses may be used but one aspect of the invention is that thin nitride film 122 is a comparatively thin layer of material. Thin nitride film 122 may advantageously be $SiN_x$ and may be formed using a variety of types of chemical vapor deposition (CVD) processes such as low pressure chemical vapor deposition (LPCVD), plasma-enhanced chemical vapor deposition (PECVD), high density plasma chemical vapor deposition (HDPCVD), rapid thermal chemical vapor deposition (RTCVD), cyclic deposition (CLD), atomic layer deposition (ALD), and mixed deposition (MLD).

Figure 2C:
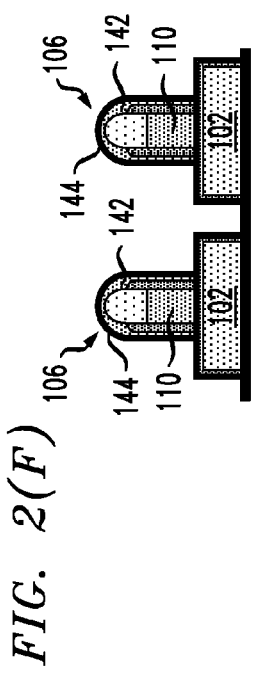

After the formation of thin nitride film 122, an LDD or PKT implant or both may be carried out as shown in FIG. 2(C). FIG. 2(C) includes arrows 126 that indicate the acceleration of dopant species being implanted into semiconductor fin 102 and other exposed semiconductor portions. According to one exemplary embodiment, the implantation process may be a lightly doped drain, LDD, implant operation and according to another exemplary embodiment, the implant operation may be a packet, PKT, implant operation. The implantation process may advantageously utilize a suitable angled implant such that the sides (refer to FIG. 3), of semiconductor fin 102 not covered by gate structure 106, are also implanted with dopant impurities. Various suitable species may be used as the dopant species, and various implantation conditions and settings may be used.

The dopant impurities are introduced through thin nitride film 122 and into semiconductor fins 102. Because of the presence of thin nitride film 122, it has been found that the implantation processes carried out at this stage do not damage the high-k gate dielectric (116 in FIG. 3) or metal gate film (118) formed at interface 108. Also because of the presence of thin nitride film 122, surfaces 104 of semiconductor fins 102 are not damaged. In one embodiment, thin nitride film 122 may be an $SiCN_x$ film formed to include a low etch rate in various wet chemistries used in semiconductor device fabrication as discussed, infra. In other exemplary embodiments, thin nitride film 122 may be formed to include various thicknesses and etch rates. After the implant operation illustrated in FIG. 2(C) has taken place, an annealing process may advantageously be carried out to avoid deactivation that may be induced by film deposition.

Figure 2D:
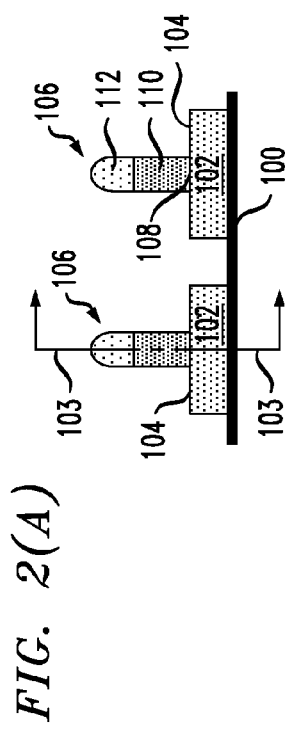

After the implant operation and annealing operation has taken place, a second nitride film 134 is formed as shown in FIG. 2(D). Second nitride film 134 may advantageously be $SiCN_x$ and may include a thickness of about 16 nm according to one advantageous embodiment. Second nitride film 134 will also be formed to include a low wet etch rate as described with respect to thin nitride film 122, supra, and may be formed using a PECVD, plasma enhanced chemical vapor deposition, LPCVD, low pressure chemical vapor deposition, or ALD, atomic layer deposition, process. For example, second nitride film 134 may include an etch rate of less than about 20 angstroms/minute in a solution of $H_3PO_4$, and less than about 20 angstroms/minute in a dilute HF acid etching solution. Second nitride film 134 may include a thickness ranging from about 10-50 nm in various exemplary embodiments, but may include other thicknesses in other exemplary embodiments and will generally be selected to have a low wet etch rate and be resistant to etching and attack in chemical solutions typically used to etch oxide layers and nitride materials, for example.

Figure 2E:
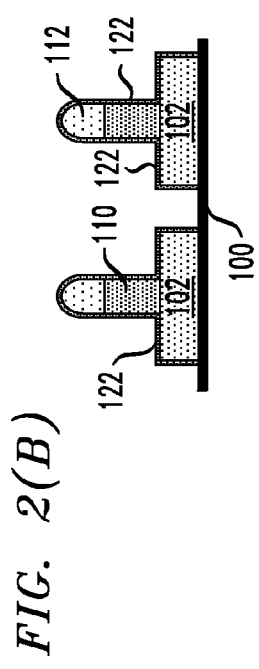
Figure 2F:
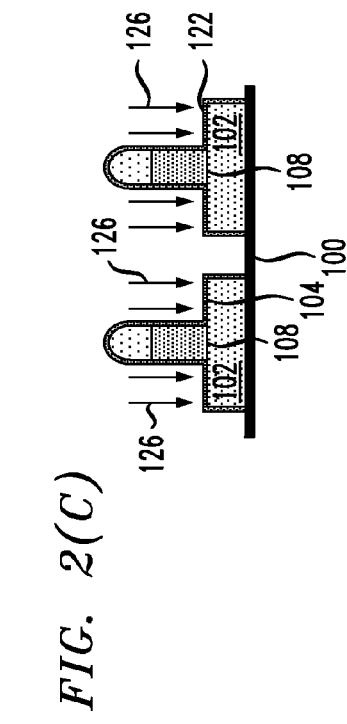

A conventional anisotropic etching operation may be performed upon the structure shown in FIG. 2(D) to produce sidewall spacers 138 shown in FIG. 2(E). Sidewall spacers 138 include portions of both thin nitride film 122 and second nitride film 134. With second nitride film 134, forming the outer portion of sidewall spacers 138, the spacers are resistant to attack in $H_3PO_4$ and dilute HF acid solutions. The low wet etch rate of sidewall spacers 138 manifests itself in the subsequent processing operations that can be advantageously carried out with sidewall spacers 138 intact. For example, FIG. 2(F) shows oxide 142 and nitride 144 films formed as dummy layers over the structure shown in FIG. 2(E). According to one exemplary embodiment, oxide film 142 may include a thickness of about 4-10 nm and nitride film 144 may include a thickness of about 5-10 nm but these thicknesses may vary in other exemplary embodiments.

In FIG. 2(G) it can be seen that nitride film 144 is removed and in FIG. 2(H), oxide film 142 is also removed from the semiconductor fin 102 illustrated at the left hand side of the drawing. According to one exemplary embodiment, the semiconductor fin 102 illustrated at the left hand side of the drawing may be a semiconductor fin of a first polarity and the semiconductor fin 102 illustrated at the right hand side of the drawing may be a semiconductor fin of the opposite polarity. This is intended to be exemplary only. Hereinafter, the semiconductor fin 102 illustrated on the left hand side of the drawing will be labeled and referred to as semiconductor fin 102A and the semiconductor fin on the right hand side will be labeled and referred to as semiconductor fin 102B. A conventional $H_3PO_4$ etching solution may be used to remove nitride film 144 and a conventional dilute HF acid may be used to remove oxide film 142 from semiconductor fin 102A in FIG. 2(G) to expose sidewall spacer 138 without attacking sidewall spacer 138 or damaging the high-k gate dielectric (116 in FIG. 3) or metal gate film (118) formed at interface 108, due to the low wet etch rate of sidewall spacers 138. Silicon is then epitaxially grown on exposed Si surfaces using the intact sidewall spacers 138 to determine the location of the epitaxial silicon and epitaxial silicon film 148 is illustrated on exposed silicon surfaces of semiconductor fin 102A to produce the structure shown in FIG. 2(H).

FIG. 2(I) shows the structure of FIG. 2(H) after a protective film 154 has been formed over semiconductor fin 102A. Protective film 154 may be a $SiN_x$ film in one exemplary embodiment but other materials may be used in other exemplary embodiments. FIG. 2(J) shows the removal of nitride film 144 and oxide film 142 from over semiconductor 102B according to previously described methods. Conventional means may be used to form a pattern such that semiconductor fin 102A is protected while the etching processes are carried out to remove the films from over semiconductor fin 102B. After the films are removed to expose sidewall spacer 138 on semiconductor fin 102B, sidewall spacer 138 is used to define the area in which an SiGe layer may be formed. SiGe layer 158 is shown in FIG. 2(J), such as selectively formed on semiconductor fin 102B.

Figure 2M:
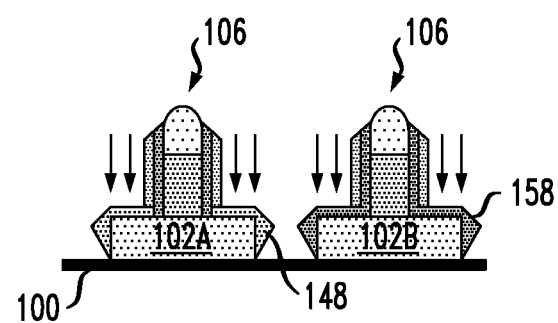

Protective film 154 is removed using conventional methods to form the structure shown in FIG. 2(K). Further spacers 162 are then formed as shown in FIG. 2(L), according to conventional methods and to provide a wider CD for the subsequent implanting operation shown in FIG. 2(M). FIG. 2(M) shows a single implantation operation indicated by arrows 166 and which may be used as a source/drain implant. According to the illustration of FIG. 2(M), the source/drain implant implants dopant impurities into both semiconductor fins 102A and 102B and, particularly into epitaxial silicon layer 148 and SiGe layer 158. It should be understood, however, that separate implantation operations may be carried out to separately implant the source/drain regions of semiconductor fin 102A and then semiconductor fin 102B.

Further processing operations as known in the art may then be used to complete the fabrication of FinFET transistor devices using gate structures 106 and also for providing interconnection to and between such devices.

The different processing operations carried out on side-by-side semiconductor fins 102A and 102B is presented for brevity of description and is intended to be exemplary only. In other exemplary embodiments, further different processing operations may also be carried out on further semiconductor fins on the same substrate, and in still other exemplary embodiments, only one sequence of processing sequence of operations may be common to all semiconductor fins.

In a method for forming a transistor on a semiconductor fin device, the method including the steps of forming a fin and forming a metal gate structure over the fin, the disclosure provides an improvement comprising: after defining the metal gate structure, forming a nitride layer directly on the fin and the metal gate structure, then implanting dopant impurities into the fin through the nitride layer prior to forming spacers alongside the metal gate structure, the metal gate structure comprising a metal film over the fin and a polysilicon gate material over the metal film.

Also provided is a method for forming a semiconductor device. The method comprises forming a semiconductor fin over a substrate; forming a metal gate structure over the semiconductor fin; forming a thin nitride layer directly on the semiconductor fin and the metal gate structure and implanting dopant impurities into the semiconductor fin through the thin nitride layer prior to forming any spacers alongside the metal gate structure; and, forming spacers comprising the thin nitride layer alongside the metal gate structure.

Also provided is a further method for forming a semiconductor device. The method comprises forming a semiconductor fin over a substrate; forming a metal gate structure over the semiconductor fin, the metal gate structure comprising a high-k gate dielectric, a metal gate film over the high-k gate dielectric and a polysilicon gate over the metal gate film; prior to forming any spacers alongside the metal gate structure. The method further comprises forming a thin nitride layer directly on the semiconductor fin and the metal gate structure and implanting dopant impurities into the semiconductor fin through the thin nitride layer; forming a further nitride layer over the thin nitride layer; and forming spacers comprising the thin nitride layer and the further nitride layer alongside the metal gate structure.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. In a method for forming a transistor on a semiconductor fin device, the method including the steps of forming a fin and forming a metal gate structure over the fin, the improvement comprising:
    after defining said metal gate structure, forming a nitride layer directly on said fin and said metal gate structure,
    then implanting dopant impurities into said fin through said nitride layer prior to forming spacers alongside said metal gate structure,
    said metal gate structure comprising a metal film over said fin and a polysilicon gate material over said metal film.

2. In the method of claim 1, wherein said metal gate structure comprises said metal film disposed over a high-k gate dielectric.

3. In the method of claim 1, wherein said implanting dopant impurities comprises at least one of a LDD (lightly doped drain) implant and a PKT (packet) implant.

4. In the method as in claim 1, further comprising forming a $SiCN_x$ layer over said thin nitride layer after said implanting and forming spacers comprising said nitride layer and said $SiCN_x$ layer, alongside said metal gate structure.

5. In the method of claim 4, wherein said forming a $SiCN_x$ layer comprises at least one of low pressure chemical vapor deposition (LPCVD), plasma-enhanced chemical vapor deposition (PECVD), high density plasma chemical vapor deposition (HDPCVD), rapid thermal chemical vapor deposition (RTCVD), cyclic deposition (CLD), atomic layer deposition (ALD), and mixed deposition (MLD).

6. A method for forming a semiconductor device comprising:
    forming a semiconductor fin over a substrate;
    forming a metal gate structure over said semiconductor fin;
    forming a thin nitride layer directly on said semiconductor fin and said metal gate structure and implanting dopant impurities into said semiconductor fin through said thin nitride layer prior to forming any spacers alongside said metal gate structure; and
    forming spacers comprising said thin nitride layer alongside said metal gate structure.

7. The method as in claim 6, wherein said metal gate structure comprises a metal gate film over a high-k gate dielectric and a polysilicon gate over said metal film.

8. The method as in claim 6, further comprising forming a $SiCN_x$ layer over said thin nitride layer and wherein said spacers are further comprised of said $SiCN_x$ layer.

9. The method as in claim 8, wherein said thin nitride layer includes a thickness of about 5 nm, and said forming a $SiCN_x$ layer comprises at least one of low pressure chemical vapor deposition (LPCVD), plasma-enhanced chemical vapor deposition (PECVD), high density plasma chemical vapor deposition (HDPCVD), rapid thermal chemical vapor deposition (RTCVD), cyclic deposition (CLD), atomic layer deposition (ALD), and mixed deposition (MLD).

10. The method as in claim 8, further comprising annealing after said implanting and before said forming a $SiCN_x$ layer, and forming one of SiGe and epitaxial silicon on exposed portions of said semiconductor fin not covered by said spacers.

11. The method as in claim 6, wherein said implanting comprises at least one of a LDD (lightly doped drain) implant and a PKT (packet) implant.

12. A method for forming a semiconductor device comprising:
    forming a semiconductor fin over a substrate;
    forming a metal gate structure over said semiconductor fin, said metal gate structure comprising a high-k gate dielectric, a metal gate film over said high-k gate dielectric and a polysilicon gate over said metal gate film;
    prior to forming any spacers alongside said metal gate structure, forming a thin nitride layer directly on said semiconductor fin and said metal gate structure and implanting dopant impurities into said semiconductor fin through said thin nitride layer;
    forming a further nitride layer over said thin nitride layer; and
    forming spacers comprising said thin nitride layer and said further nitride layer alongside said metal gate structure.

13. The method as in claim 12, wherein said implanting dopant impurities comprises at least one of a LDD (lightly doped drain) implant and a PKT (packet) implant.

14. The method as in claim 12, wherein said forming a further nitride layer comprises forming a $SiCN_x$ layer using at least one of low pressure chemical vapor deposition (LPCVD), plasma-enhanced chemical vapor deposition (PECVD), high density plasma chemical vapor deposition (HDPCVD), rapid thermal chemical vapor deposition (RTCVD), cyclic deposition (CLD), atomic layer deposition (ALD), and mixed deposition (MLD).

15. The method as in claim 12, wherein said forming a metal gate structure includes a hard mask over said polysilicon gate and further comprising utilizing said spacers in further processing operations to form a transistor device.

16. The method as in claim 12, wherein said further nitride layer comprises $SiCN_x$ and further comprising, after said forming spacers, performing at least one wet clean operation using at least one of $H_3PO_4$ and dilute HF acid, then epitaxially growing silicon on said semiconductor fin in exposed regions not covered by said spacers or said metal gate structure such that said spacers thereby define said exposed regions of said epitaxial silicon growth.

17. The method as in claim 12, further comprising depositing silicon geranium on said semiconductor fin in exposed regions not covered by said spacers or said metal gate structure such that said spacers thereby define said exposed regions.

18. The method as in claim 12, further comprising, after said forming spacers, forming an oxide dummy film and a nitride dummy film over said semiconductor fin then removing said nitride dummy film and said oxide dummy film and epitaxially forming silicon on exposed surfaces of said semiconductor fin, said removing said nitride dummy film and said removing said oxide dummy film comprising using a wet etching solution of at least one of $H_3PO_4$ and dilute HF acid and wherein said removing said oxide dummy film exposes said exposed silicon sections.

* * * * *